(12) United States Patent
Zhao et al.

(10) Patent No.: US 10,510,364 B2
(45) Date of Patent: Dec. 17, 2019

(54) DEVICES INCLUDING A NEAR FIELD TRANSDUCER (NFT) WITH NANOPARTICLES

(71) Applicant: SEAGATE TECHNOLOGY LLC, Cupenino, CA (US)

(72) Inventors: Tong Zhao, Eden Prairie, MN (US); Justin Brons, Savage, MN (US); Steven C. Riemer, Minneapolis, MN (US); Michael C. Kautzky, Eagan, MN (US); Xiaoyue Huang, Eden Prairie, MN (US); Sarbeswar Sahoo, Shakopee, MN (US)

(73) Assignee: Seagate Technology LLC, Cupertino, CA (US)

( * ) Notice: Subject to any disclaimer, the term of this patent is extended or adjusted under 35 U.S.C. 154(b) by 735 days.

(21) Appl. No.: 14/935,753

(22) Filed: Nov. 9, 2015

(65) Prior Publication Data
US 2016/0133279 A1    May 12, 2016

Related U.S. Application Data

(60) Provisional application No. 62/078,848, filed on Nov. 12, 2014.

(51) Int. Cl.
*G11B 5/00* (2006.01)
*G11B 5/31* (2006.01)
(Continued)

(52) U.S. Cl.
CPC .......... *G11B 5/314* (2013.01); *C23C 14/0036* (2013.01); *C23C 14/0635* (2013.01);
(Continued)

(58) Field of Classification Search
None
See application file for complete search history.

(56) References Cited

U.S. PATENT DOCUMENTS

| 4,492,873 A | 1/1985 | Dmitriev |
|---|---|---|
| 5,482,611 A | 1/1996 | Helmer |

(Continued)

FOREIGN PATENT DOCUMENTS

| EP | 024088 | 10/1987 |
|---|---|---|
| EP | 0580368 | 1/1994 |

(Continued)

OTHER PUBLICATIONS

U.S. Appl. No. 13/923,925, filed Jun. 21, 2013, Pitcher.
(Continued)

*Primary Examiner* — Necholus Ogden, Jr.
(74) *Attorney, Agent, or Firm* — Mueting, Raasch & Gebhardt, P.A.

(57) ABSTRACT

Devices that include a near field transducer (NFT) including a crystalline plasmonic material having crystal grains and grain boundaries; and nanoparticles disposed in the crystal grains, on the grain boundaries, or some combination thereof, wherein the nanoparticles are oxides of, lanthanum (La), barium (Ba), strontium (Sr), erbium (Er), hafnium (Hf), germanium (Ge), or combinations thereof; nitrides of zirconium (Zr), niobium (Nb), or combinations thereof; or carbides of silicon (Si), aluminum (Al), boron (B), zirconium (Zr), tungsten (W), titanium (Ti), niobium (Nb), or combinations thereof.

15 Claims, 3 Drawing Sheets

(51) Int. Cl.
  *C23C 14/34* (2006.01)
  *C23C 14/08* (2006.01)
  *C23C 14/06* (2006.01)
  *C23C 14/00* (2006.01)
  *C23C 14/18* (2006.01)
  C23C 16/455 (2006.01)
  C23C 16/40 (2006.01)

(52) U.S. Cl.
  CPC .......... *C23C 14/0641* (2013.01); *C23C 14/08* (2013.01); *C23C 14/185* (2013.01); *C23C 14/3464* (2013.01); *G11B 5/3106* (2013.01); *C23C 16/403* (2013.01); *C23C 16/45555* (2013.01); *G11B 2005/0021* (2013.01)

(56) References Cited

U.S. PATENT DOCUMENTS

| | | |
|---|---|---|
| 5,849,093 A | 12/1998 | Andra |
| 5,945,681 A | 8/1999 | Tokiguchi |
| 6,130,436 A | 10/2000 | Renau |
| 6,144,098 A | 11/2000 | Iyer |
| 6,589,676 B1 | 7/2003 | Gui |
| 6,632,483 B1 | 10/2003 | Callegari |
| 6,641,932 B1 | 11/2003 | Xu |
| 6,683,426 B1 | 1/2004 | Kleeven |
| 6,795,630 B2 | 9/2004 | Challener |
| 6,999,384 B2 | 2/2006 | Stancil |
| 7,002,228 B2 | 2/2006 | Deak |
| 7,018,729 B2 | 3/2006 | Pocker |
| 7,032,427 B2 | 4/2006 | Niwa |
| 7,262,936 B2 | 8/2007 | Hamann |
| 7,272,079 B2 | 9/2007 | Challener |
| 7,330,404 B2 | 2/2008 | Peng |
| 7,377,228 B2 | 5/2008 | MacK |
| 7,476,855 B2 | 1/2009 | Huang |
| 7,538,978 B2 | 5/2009 | Sato |
| 7,544,958 B2 | 6/2009 | Low |
| 7,609,003 B2 | 10/2009 | Horsky |
| 7,690,009 B2 | 3/2010 | Miyanishi |
| 7,791,839 B2 | 9/2010 | Olson |
| 7,961,417 B2 | 6/2011 | Seigler |
| 7,965,464 B2 | 6/2011 | Batra |
| 7,986,592 B2 | 7/2011 | Hirano |
| 8,023,225 B2 | 9/2011 | Shimazawa |
| 8,031,561 B2 | 10/2011 | Hellwing |
| 8,040,761 B2 | 11/2011 | Kawamori |
| 8,077,556 B2 | 12/2011 | Komura |
| 8,107,325 B2 | 1/2012 | Komura |
| 8,116,176 B2 | 2/2012 | Kato |
| 8,194,510 B2 | 6/2012 | Sasaki |
| 8,194,511 B2 | 6/2012 | Sasaki |
| 8,213,272 B2 | 7/2012 | Takayama |
| 8,223,597 B2 | 7/2012 | Komura |
| 8,248,891 B2 | 8/2012 | Lee |
| 8,284,521 B2 | 10/2012 | Ohtsu |
| 8,284,635 B2 | 10/2012 | Matsumoto |
| 8,289,650 B2 | 10/2012 | Seigler |
| 8,320,220 B1 | 11/2012 | Yuan |
| 8,325,567 B2 | 12/2012 | Miyauchi |
| 8,331,205 B2 | 12/2012 | Seigler |
| 8,339,740 B2 | 12/2012 | Zou |
| 8,351,151 B2 | 1/2013 | Katine |
| 8,385,159 B2 | 2/2013 | Gao |
| 8,400,902 B2 | 3/2013 | Huang |
| 8,405,056 B2 | 3/2013 | Amaldi |
| 8,405,932 B2 | 3/2013 | Seigler |
| 8,451,705 B2 | 3/2013 | Shimazawa |
| 8,416,647 B1 | 4/2013 | Zhao |
| 8,427,925 B2 | 4/2013 | Zhao |
| 8,451,555 B2 | 5/2013 | Seigler |
| 8,477,454 B2 | 7/2013 | Zou |
| 8,514,673 B1 | 8/2013 | Zhao |
| 8,553,505 B2 | 10/2013 | Rawat |
| 8,670,215 B2 | 3/2014 | Zou |
| 8,675,457 B1 | 3/2014 | Hirata |
| 8,711,662 B2 | 4/2014 | Lee |
| 8,773,959 B2 | 5/2014 | Moriya |
| 8,830,800 B1 | 9/2014 | Pitcher |
| 8,917,581 B1 | 12/2014 | Mallary |
| 8,934,198 B2 | 1/2015 | Zou |
| 8,958,168 B1 | 2/2015 | Yuan |
| 9,058,824 B2 | 6/2015 | Cheng |
| 9,245,573 B2 | 1/2016 | Sahoo |
| 9,502,070 B2 | 11/2016 | Cheng |
| 9,822,444 B2 | 11/2017 | Zhao |
| 2005/0012052 A1 | 1/2005 | Platzgummer |
| 2005/0190496 A1 | 9/2005 | Hamann |
| 2006/0238133 A1 | 10/2006 | Horsky |
| 2007/0069383 A1 | 3/2007 | Suzuki |
| 2008/0230724 A1 | 9/2008 | Low |
| 2009/0073858 A1 | 3/2009 | Seigler |
| 2009/0130365 A1 | 5/2009 | Kojima |
| 2009/0225636 A1 | 9/2009 | Hirano |
| 2010/0103553 A1 | 4/2010 | Shimazawa |
| 2010/0123965 A1 | 5/2010 | Lee |
| 2010/0123967 A1 | 5/2010 | Batra |
| 2010/0128579 A1 | 5/2010 | Seigler |
| 2010/0149930 A1 | 6/2010 | Komura |
| 2010/0157746 A1 | 6/2010 | Hongo |
| 2010/0190036 A1 | 7/2010 | Komvopoulos |
| 2010/0214685 A1 | 8/2010 | Seigler |
| 2010/0309581 A1 | 12/2010 | Wu |
| 2010/0315736 A1 | 12/2010 | Takayama |
| 2010/0320403 A1 | 12/2010 | Amaldi |
| 2010/0329085 A1 | 12/2010 | Kawamori |
| 2011/0006214 A1 | 1/2011 | Bonig |
| 2011/0026161 A1 | 2/2011 | Ikeda |
| 2011/0038236 A1 | 2/2011 | Mizuno |
| 2011/0058272 A1 | 3/2011 | Miyauchi |
| 2011/0096431 A1 | 4/2011 | Hellwig |
| 2011/0122735 A1 | 5/2011 | Kato |
| 2011/0205863 A1* | 8/2011 | Zhao ..................... B82Y 10/00 369/13.33 |
| 2012/0045662 A1 | 2/2012 | Zou |
| 2012/0105996 A1 | 5/2012 | Katine |
| 2012/0127839 A1 | 5/2012 | Rawat |
| 2012/0163139 A1 | 6/2012 | Vavra |
| 2012/0213042 A1 | 8/2012 | Aoki |
| 2012/0201491 A1 | 9/2012 | Zhou |
| 2013/0107679 A1 | 5/2013 | Huang |
| 2013/0108212 A1 | 5/2013 | Peng |
| 2013/0161505 A1 | 6/2013 | Pitcher |
| 2013/0164453 A1 | 6/2013 | Pitcher |
| 2013/0164454 A1 | 6/2013 | Pitcher |
| 2013/0176839 A1 | 7/2013 | Peng |
| 2013/0235707 A1 | 9/2013 | Zhao |
| 2013/0279315 A1 | 10/2013 | Zhao |
| 2013/0286799 A1 | 10/2013 | Zhu |
| 2013/0286804 A1 | 10/2013 | Zhao |
| 2013/0288077 A1 | 10/2013 | Dhawan |
| 2014/0004384 A1 | 1/2014 | Zhao |
| 2014/0043948 A1 | 2/2014 | Hirata |
| 2014/0050057 A1 | 2/2014 | Zou |
| 2014/0050058 A1 | 2/2014 | Zou |
| 2014/0113160 A1 | 4/2014 | Pitcher |
| 2014/0177405 A1 | 6/2014 | Rejda |
| 2014/0254335 A1 | 9/2014 | Gage |
| 2014/0376349 A1 | 12/2014 | Cheng |
| 2014/0376350 A1* | 12/2014 | Cheng ................. G11B 5/4866 369/13.33 |
| 2014/0376351 A1 | 12/2014 | Cheng |
| 2014/0376352 A1 | 12/2014 | Cheng |
| 2015/0132503 A1 | 5/2015 | Kautzky |
| 2015/0162028 A1 | 6/2015 | Jayashankar |
| 2015/0179194 A1 | 6/2015 | Cheng |
| 2015/0340052 A1 | 11/2015 | Sankar |
| 2016/0133277 A1 | 5/2016 | Cheng |
| 2016/0133279 A1 | 5/2016 | Zhao |

(56) References Cited

U.S. PATENT DOCUMENTS

2016/0275972 A1 9/2016 Zhao
2017/0263276 A1 9/2017 Sankar

FOREIGN PATENT DOCUMENTS

| EP | 0942072 | 9/1999 |
|---|---|---|
| EP | 1328027 | 7/2003 |
| EP | 2106678 | 10/2009 |
| JP | 2011198450 | 10/2011 |
| JP | 20111238991 | 12/2011 |
| TW | 200929183 | 7/2009 |
| WO | WO 97/45834 | 12/1997 |
| WO | WO 2013/163195 | 10/2013 |
| WO | WO 2013/163470 | 10/2013 |

OTHER PUBLICATIONS

U.S. Appl. No. 14/062,651, filed Oct. 24, 2013, Zou.
Al-Bayati et al., Junction Profiles of Sub keV Ion Implantation for Deep Sub-Quarter Micron Devices, IEEE, 2000, pp. 87-90.
Angel et al., "Enhanced Low Energy Drift-Mode Beam Currents in a High Current Ion Implanter," IEEE, 1999, pp. 219-222.
Bannuru et al., "The Electrical and Mechanical Properties of Au-V and Au-V2O5 Thin Films for Wear-Resistant RF MEMS Switches", Journal of Applied Physics, 103, (2008), pp. 083522-1-083522-6.
Druz et al., "Diamond-Like Carbon Films Deposited Using a Broad, Uniform Ion Beam from an RF Inductively Coupled CH4-Plasma Source", Diamond and Related Materials, vol. 7, No. 7, Jul. 1998, pp. 965-972.
Liu et al., "Influence of the Incident Angle of Energetic Carbon Ions on the Properties of Tetrahedral Amorphous Carbon (ta-C) films", Journal of Vacuum Science and Technology, vol. 21, No. 5, Jul. 25, 2003, pp. 1665-1670.
Metallization: "Metallization; chapter 5", In: Kris v. Srikrishnan and Geraldine C. Schwartz: "Handbook of Semiconductor Interconnection Technology, Second Edition", 2006, CRC Press, Boca Raton, FL, USA, XP002711255, ISBN:978-1-4200-1765-6, pp. 311-382, Section 5.4.1.2 Adhesion; p. 320.
PCT/US2013/038120 Search Report and Written Opinion dated Jul. 19, 2013 (8 pages).
Piazza et al., "Large Area Deposition of Hydrogenated Amorphous Carbon Films for Optical Storage Disks", Diamond and Related Materials, vol. 13, No. 4-8, Apr. 2004, pp. 1505-1510.
Robertson, J., "Diamond-Like Amorphous Carbon," *Materials Science and Engineering R* 37, 2002, pp. 129-281.
Satoh et al., "Evaluation of Adhesion Materials for Gold Line-and-Space Surface Plasmon Antenna on SO1-MOS Photodiode", Silicon Nanoelectronics Workshop (SNW), 2010, IEEE, Piscataway, NJ, USA, Jun. 13, 2010, pp. 1-2.
Vogt, K.W. et al., "Characterization of Thin Titanium Oxide Adhesion Layers on Gold Resistivity, Morphology, and Composition", *Surface Science*, North-Holland, Amsterdam, NL, vol. 301, No. 1-3, Jan. 10, 1994, pp. 203-213.
Williams et al., "Strenghtening Gold Thin Films with Zirconia Nanoparticles for MEMS Electrical Contacts", Acta Materialia 56, (2008), pp. 1813-1819.
PCT International Search Report and Written Opinion for PCT/US2015/059671 dated Apr. 29, 2016 (12 pages).
Challener et al., "Heat-Assisted Magnetic Recording by a Near-Field Transducer with Efficient Optical Energy Transfer," *Journal of Applied Physics*, Mar. 22, 2009.
Weller et al., "A HAMR Media Technology Roadmap to an Areal Density of 4 Tb/in$^2$", *IEEE Transactions on Magnetics*, vol. 50, No. 1, Jan. 2014.

\* cited by examiner

US 10,510,364 B2

DEVICES INCLUDING A NEAR FIELD TRANSDUCER (NFT) WITH NANOPARTICLES

PRIORITY

This application claims priority to U.S. Provisional Application No. 62/078,848 entitled, NEAR FIELD TRANSDUCERS (NFTS) INCLUDING NITRIDE, OXIDE, CARBIDE, OR COMBINATIONS THEREOF, filed on Nov. 12, 2014, the disclosure of which is incorporated herein by reference thereto.

SUMMARY

Disclosed are devices that include a near field transducer (NFT) including a crystalline plasmonic material having crystal grains and grain boundaries; and nanoparticles disposed in the crystal grains, on the grain boundaries, or some combination thereof, wherein the nanoparticles are oxides of, lanthanum (La), barium (Ba), strontium (Sr), erbium (Er), hafnium (Hf), germanium (Ge), or combinations thereof; nitrides of zirconium (Zr), niobium (Nb), or combinations thereof; or carbides of silicon (Si), aluminum (Al), boron (B), zirconium (Zr), tungsten (W), titanium (Ti), niobium (Nb), or combinations thereof.

Also disclosed are devices that include a near field transducer (NFT) including a crystalline plasmonic material having crystal grains and grain boundaries; and nanoparticles disposed preferentially on the grain boundaries, or some combination thereof, wherein the nanoparticles are oxides of yttrium (Y), lanthanum (La), barium (Ba), strontium (Sr), erbium (Er), zirconium (Zr), hafnium (Hf), germanium (Ge), silicon (Si), or combinations thereof; nitrides of zirconium (Zr), titanium (Ti), tantalum (Ta), aluminum (Al), boron (B), niobium (Nb), or combinations thereof; or carbides of silicon (Si), aluminum (Al), boron (B), zirconium (Zr), tungsten (W), titanium (Ti), niobium (Nb), or combinations thereof.

Also disclosed are methods that include forming a layer comprising a plasmonic material; forming a layer comprising a metal; and oxidizing, nitriding or carbiding the metal to form nanoparticles of metal oxide, metal nitride or metal carbide respectively.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples can be used in various combinations. In each instance, the recited list serves only as a representative group and should not be interpreted as an exclusive list.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
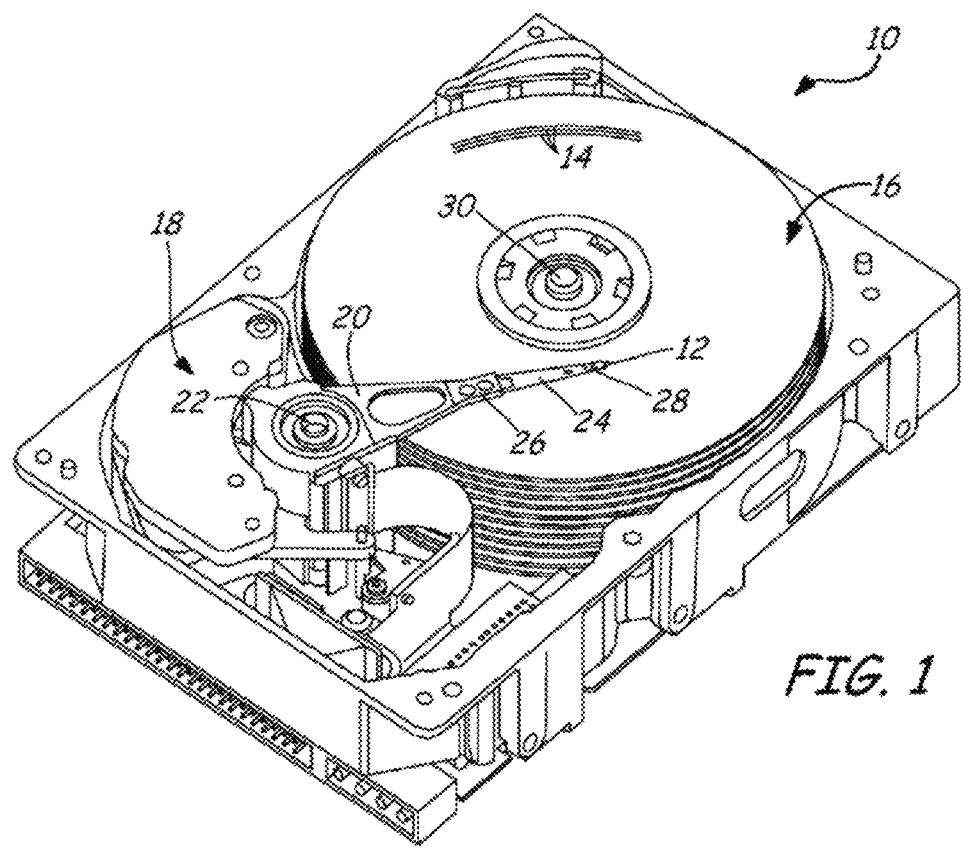
FIG. 1 is a perspective view of a magnetic disc drive that can include HAMR devices.

Heat assisted magnetic recording (referred to through as HAMR) utilizes radiation, for example from a laser, to heat media to a temperature above its curie temperature, enabling magnetic recording. In order to deliver the radiation, e.g., a laser beam, to a small area (on the order of 20 to 50 nm for example) of the medium, a NFT is utilized. During a magnetic recording operation, the NFT absorbs energy from a laser and focuses it to a very small area; this can cause the temperature of the NFT to increase. The temperature of the NFT can be elevated up to about 400° C. or more.

One method that has been utilized to stabilize the NFT in the high operating temperatures is to add materials to the main plasmonic material of the NFT. Metal dopants (for example) and adhesives have relatively high oxidation tendencies and will move to an oxidation source, e.g., the NFT surface when it is exposed to air or $O_2$. Grain boundaries are a more preferred diffusion path for materials than is a crystalline lattice. Oxygen can also quickly diffuse through grain boundaries, and thus metal dopants or adhesives can be oxidized. Dopants lose their grain stabilization ability once they have left the plasmonic grains and have segregated to the NFT surface. Additionally, adhesives will lose their adhesion benefit once they have been oxidized or segregated to the NFT surface and oxidized.

During the manufacture of a HAMR head, various oxidizing processes are utilized, for example oxygen ($O_2$) ashing, oxygen ($O_2$) etching and high temperature annealing can all be utilized. A cap layer can be used in situ during NFT peg deposition and formation to protect the peg from dopant/seed segregation to the top of the NFT, the sides of the NFT are not as easily protected. Current head overcoat materials are known to be permeable to oxygen and can allow oxygen to be in contact with the NFT during HAMR operation and thus cause those metallic elements to segregate and be oxidized. A solution is therefore need to make the plasmonic material of the NFT stable and less sensitive to oxygen-containing environments.

Disclosed NFTs include a plasmonic material (e.g., gold (Au), silver (Ag), rhodium (Rh), ruthenium (Ru), aluminum (Al), copper (Cu), etc.) where the grain boundaries include nanoparticles. Nanoparticles disposed in grain boundaries can block metal and/or oxygen diffusion paths along grain boundaries both vertically and horizontally. The dopants therefore stay in the plasmonic material and stabilize the grains. Furthermore, adhesives are more likely to stay in place to provide their designed adhesion benefit. The particles themselves (depending on their oxidation state) at the plasmonic/NPS (NFT to pole space) interface might also provide adhesion benefits between the plasmonic material and the oxide (of the NPS). The addition of nanoparticles to the NFT material also makes the plasmonic material less sensitive to downstream processes (e.g., $O_2$ ashing, oxygen ($O_2$) etching and high temperature annealing etc.).

FIG. 1 is a perspective view of disc drive 10 including an actuation system for positioning slider 12 over track 14 of magnetic medium 16. The system depicted in FIGS. 1 and 2 can include disclosed structures and multilayer gas barrier layers. The particular configuration of disc drive 10 is shown for ease of description and is not intended to limit the scope of the present disclosure in any way. Disc drive 10 includes voice coil motor 18 arranged to rotate actuator arm 20 on a spindle around axis 22. Load beam 24 is connected to actuator arm 20 at head mounting block 26. Suspension 28 is connected to an end of load beam 24 and slider 12 is attached to suspension 28. Magnetic medium 16 rotates around an axis 30, so that the windage is encountered by slider 12 to keep it aloft a small distance above the surface of magnetic medium 16. Each track 14 of magnetic medium 16 is formatted with an array of data storage cells for storing data. Slider 12 carries a magnetic device or transducer (not shown in FIG. 1) for reading and/or writing data on tracks 14 of magnetic medium 16. The magnetic transducer utilizes additional electromagnetic energy to heat the surface of medium 16 to facilitate recording by a process termed heat assisted magnetic recording (HAMR).

Figure 2:
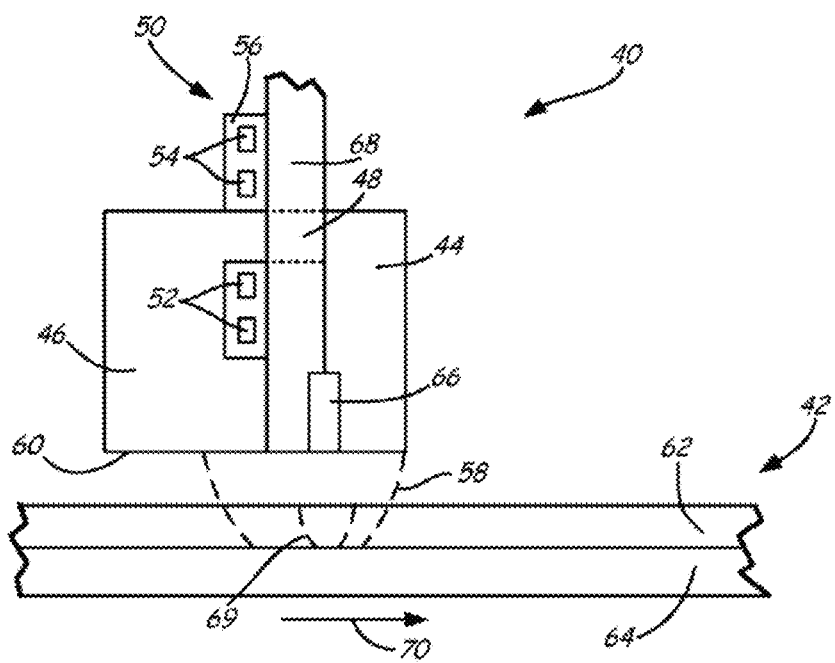
FIG. 2 is a cross sectional view of a perpendicular HAMR magnetic recording head and of an associated recording medium.

A HAMR transducer includes a magnetic writer for generating a magnetic field to write to a magnetic medium (e.g. magnetic medium 16) and an optical device to heat a portion of the magnetic medium proximate to the write field. FIG. 2 is a cross sectional view of a portion of a magnetic device, for example a HAMR magnetic device 40 and a portion of associated magnetic storage medium 42. HAMR magnetic device 40 includes write pole 44 and return pole 46 coupled by pedestal 48. Coil 50 comprising conductors 52 and 54 encircles the pedestal and is supported by an insulator 56. As shown, magnetic storage medium 42 is a perpendicular magnetic medium comprising magnetically hard storage layer 62 and soft magnetic underlayer 64 but can be other forms of media, such as patterned media. A current in the coil induces a magnetic field in the pedestal and the poles. Magnetic flux 58 exits the recording head at air bearing surface (ABS) 60 and is used to change the magnetization of portions of magnetically hard layer 62 of storage medium 42 enclosed within region 58. Near field transducer 66 is positioned adjacent the write pole 44 proximate air bearing surface 60. Near field transducer 66 is coupled to waveguide 68 that receives an electromagnetic wave from an energy source such as a laser. An electric field at the end of near field transducer 66 is used to heat a portion 69 of magnetically hard layer 62 to lower the coercivity so that the magnetic field from the write pole can affect the magnetization of the storage medium. As can be seen in FIG. 2, a portion of the near field transducer is positioned at the ABS 60 of the device.

Devices disclosed herein can also include other structures. Devices disclosed herein can be incorporated into larger devices. For example, sliders can include devices as disclosed herein. Exemplary sliders can include a slider body that has a leading edge, a trailing edge, and an air bearing surface. The write pole, read pole, optical near field transducer and contact pad (and optional heat sink) can then be located on (or in) the slider body. Such exemplary sliders can be attached to a suspension which can be incorporated into a disc drive for example. It should also be noted that disclosed devices can be utilized in systems other than disc drives such as that depicted in FIGS. 1 and 2.

Disclosed NFTs include nanoparticles in the plasmonic material that makes up the NFT. Nanoparticles, as utilized herein refers to particles (a small object that behaves as a whole unit with respect to its transport and properties) of material that have sizes from 1 to 100 nanometers (nm). More specifically, nanoparticles can include particles that have an average diameter from 1 to 100 nm. The plasmonic material that can make up the bulk of the NFT can be a pure material or it can be doped with a dopant (besides the nanoparticles). The plasmonic materials can include, for example gold (Au), silver (Ag), ruthenium (Ru), rhodium (Rh), aluminum (Al) and copper (Cu). Various dopants can be combined with any of these plasmonic materials. For example, dopants discussed in US Pat Pub Nos. 2014/0376347 and 2014/0376351; and U.S. Pat. Nos. 8,427,925 and 8,934,198, the disclosures of which are incorporated herein by reference thereto, as well as other dopants can be combined with the primary plasmonic material.

In some embodiments, disclosed NFTs can include nanoparticles where the majority thereof are within or in the grains of the primary plasmonic material. Methods of determining the location of the nanoparticles and quantifying whether they are only within or in the grains can include transmission electron microscope (TEM) imaging showing diffraction contrast and/or atomic Zr contrast between the metal host and the nanoparticles, or a chemical element mapping technique(s) such as energy dispersive x-ray (EDX) spectroscopy or electron energy loss spectroscopy (EELS) for example.

Plasmonic materials with nanoparticles dispersed therethrough show good grain stability and much improved hardness. As such, in some embodiments, the entire NFT or at least a portion of it, e.g., the peg, includes nanoparticle strengthened plasmonic material, or stated another way, nanoparticles disposed within or in the grains. Such NFTs can be made using various methods and processes. For example, the plasmonic material and the nanoparticle material can be deposited from a composite target (a target that contains both materials). A specific illustrative example of such a target could include a gold target that includes ZrO (or ZrN or ZrC). Another method includes deposition of the plasmonic material with a metal from a composite target in a reactive environment (e.g., an $O_2$ environment if oxide nanoparticles are being formed or a $N_2$ environment if nitride nanoparticles are being formed). A specific illustrative example of such a target could include a gold target that includes Zr. Another method includes co-sputtering of a plasmonic material and a metal from individual targets in a reactive environment (e.g., an $O_2$ environment if oxide nanoparticles are being formed or a $N_2$ environment if nitride nanoparticles are being formed). A specific example of such individual targets could include Au and Zr targets. Another method includes co-sputtering a plasmonic material and an oxide (or nitride or carbide) from individual targets. Another method includes depositing a plasmonic material and flash depositing a metal and oxidizing (or another treatment to form a nitride, e.g., nitriding, or a carbide, e.g., carbiding), and repeating these two steps. Another method includes depositing a plasmonic material and flash depositing via atomic layer deposition a metal oxide (or nitride or carbide), and then repeating these two steps. Another method can include plasmonic material deposition via sputtering plus flash deposition of oxides (or nitrides or carbides) by a different method (for example physical vapor deposition (PVD), etc.). In some embodiments, plasmonic materials with nanoparticles dispersed therethrough can be co-sputtered from a composite target or individual targets.

In some embodiments, disclosed NFTs can include nanoparticles preferentially at the grain boundaries as opposed to within the grains. Nanoparticles described herein as being on the grain boundaries can also include nanoparticles which are physically in the grain boundary, where the nanoparticle is in the grain boundary within the bulk of the plasmonic material, not on a grain boundary at a surface of the plasmonic material. Such nanoparticles may provide various benefits: they may stabilize the plasmonic grains from grain growth and they may block diffusion paths for seed, dopants or oxygen through the plasmonic grain boundaries to prevent seed and/or dopant oxidation and segregation, or any combination thereof. Additionally, nanoparticles at the grain boundaries may have less of an optical penalty than nanoparticles in the grains would. Grain boundaries themselves are already scattering sources in a polycrystalline film. Additionally, the penalty from the nanoparticles in the grain boundaries might be smaller than creating new scattering sources by putting the nanoparticles in the grains. In some embodiments, nanoparticles being preferentially present at grain boundaries (as opposed to preferentially present within or in the grains) may be advantageous because they may be more effective in blocking oxidation paths and impart less of an optical penalty to the NFT as a whole.

A NFT that includes nanoparticles preferentially located at the grain boundaries is one in which at least 50% of the nanoparticles are located at grain boundaries. In some embodiments, a NFT that includes nanoparticles preferentially located at the grain boundaries is one in which at least 75% of the nanoparticles are located at the grain boundaries. Methods of determining the location of the nanoparticles and quantifying whether they are only within the grain boundaries can include transmission electron microscope (TEM) imaging showing diffraction contrast and/or atomic Zr contrast between the metal host and the nanoparticles, or a chemical element mapping technique(s) such as energy dispersive x-ray (EDX) spectroscopy or electron energy loss spectroscopy (EELS) for example.

Such NFTs can be made using various methods and processes. One such method includes co-sputtering plasmonic material with another metal at relatively high temperatures (for example at least 200° C.) and periodically oxidizing (or another treatment to form a nitride or a carbide) and optionally heating the deposited material and metal. Another method includes forming a plasmonic material layer and an ultrathin metal layer thereon and then carrying our periodic oxidation steps (or another treatment to form a nitride or a carbide) and optional heating steps. Another method includes sputtering a plasmonic material and a metal from a composite target at relatively high temperatures (for example, at least 200° C.) and periodically oxidizing (or another treatment to form a nitride or a carbide) and optionally heating the deposited material and metal. A particular illustrative set of steps that can be carried out to facilitate such a method can include the following. First, the plasmonic material and a metal that can easily diffuse to the plasmonic material grain boundaries can be co-sputtered, or alternatively sputter the plasmonic material and metal from a composite target. In some embodiments, it may be more advantageous if thinner layers of plasmonic material/metal are deposited so that segregation and oxidation may become more efficient. In some embodiments, the layers have a thickness less than about 5 nm. Second, the deposition is paused to allow the metal to segregate to the plasmonic material grain boundaries. A heat treatment may optionally be utilized at this point, or throughout the deposition (without necessarily pausing growth) to facilitate the segregation to the grain boundaries. Third, an oxidation treatment (e.g., radical shower, radiation, $O_2$ plasma, annealing, etc.) can be carried out to oxidize the metal to form oxide nanoparticles. Alternatively, treatments to convert the metal to nitrides or carbides could also be carried out. These three steps can then be repeated until the desired thickness of plasmonic film/nanoparticles are produced. The resultant plasmonic material/nanoparticle film has nanoparticles residing not only in the vertical, but also lateral grain boundaries. In some embodiments, a plasmonic material film with nanoparticles on the grain boundaries can be formed using a method that includes deposition of individual layers (e.g., plasmonic material and nanoparticle material or material that will be converted into nanoparticles). In some embodiments, a plasmonic material film with nanoparticles on the grain boundaries can be formed using a method that includes deposition of individual layers (e.g., plasmonic material and nanoparticle material or material that will be converted into nanoparticles) interspersed with periodic oxidation with or without heating. In some embodiments, a plasmonic material film with nanoparticles on the grain boundaries can be formed using a method that includes deposition of individual layers (e.g., plasmonic material and nanoparticle material or material that will be converted into nanoparticles) interspersed with periodic oxidation with heating (for example, at a temperature of about 200° C. or higher).

In some embodiments, disclosed NFTs can include nanoparticles both within the grains and at the grain boundaries. In such embodiments, the amount of nanoparticles dispersed throughout the grains and in the grain boundaries can depend on various properties of the dopant, e.g., diffusivity, chemical bonding with the plasmonic material, and segregation tendencies, for example. Methods of determining the location of the nanoparticles and quantifying whether they are only within the grain boundaries can include transmission electron microscope (TEM) imaging showing diffraction contrast and/or atomic Zr contrast between the metal host and the nanoparticles, or a chemical element mapping technique(s) such as energy dispersive x-ray (EDX) spectroscopy or electron energy loss spectroscopy (EELS) for example.

Such NFTs can be made using various methods and processes. Various methods can be utilized to create nanoparticles at the grain boundaries. One such method includes forming a plasmonic layer and an ultrathin (e.g., a layer having a thickness of not greater than about 5 nm) metal oxide layer (or nitride or carbide) and repeating these two steps. Another method includes co-sputtering a plasmonic material and an oxide (or nitride or carbide) material. Various methods can be utilized to lock the grains or grain boundaries. One such method includes co-sputtering plasmonic material—metal in an oxygen ($O_2$) plasma (or another treatment to form a nitride or a carbide) at low temperatures to lock the nanoparticles within the plasmonic material grains due to their low surface mobility. Another method includes low temperature deposition of a plasmonic material layer and an ultrathin metal layer followed by periodic oxidation (or another treatment to form a nitride or a carbide). In this approach, the ultrathin oxide (or nitride or carbide) layer could provide advantages by locking the plasmonic material grain boundaries.

In some embodiments, only a portion of the NFT can include the plasmonic material with nanoparticles. For example, the top of the peg, the bottom of the peg, or both could include plasmonic material with nanoparticles in order to gain a diffusion blocking benefit while minimizing the optical penalty by keeping the nanoparticles away from the optically relevant portion of the peg. This preferential placement of the plasmonic material with nanoparticles could be accomplished using nanoparticles only within the grains of the primary plasmonic material; nanoparticles preferentially at the grain boundaries as opposed to within the grains; nanoparticles both within the grains and at the grain boundaries; or any combination thereof. The use of nanoparticles in only a portion of the NFT could also apply to non-peg/disc types of NFTs as well as heatsinks of any types of NFTs.

In some embodiments, disclosed NFTs can include nanoparticles preferentially at the interface of the NFT/NPS. The nanoparticles in such embodiments can be preferentially located on top of the grain boundaries. Methods of determining the location of the nanoparticles and quantifying whether they are only within the grain boundaries can include transmission electron microscope (TEM) imaging showing diffraction contrast and/or atomic Zr contrast between the metal host and the nanoparticles, or a chemical element mapping technique(s) such as energy dispersive x-ray (EDX) spectroscopy or electron energy loss spectroscopy (EELS) for example.

Such NFTs can be made using various methods and processes. In some embodiments, the nanoparticles are formed after the dielectric that makes up the NPS is deposited to form the NFT/NPS interface. One such method can include depositing the plasmonic material and a metal, for example the plasmonic material and the metal can be co-sputtered, sputtered from a composite target or a plasmonic material/metal layer can be formed. Then the NFT can be formed from the plasmonic material/metal. Next, the dielectric material making up the NPS can be deposited, covering the NFT. Then a heat treatment can be carried out to drive metal diffusion through the plasmonic material grain boundaries and the oxide, nitride or carbide nanoparticles can then be formed at the NFT/NPS interface.

Disclosed NFTs can include various plasmonic materials and various nanoparticles. The choice of nanoparticle depends at least in part, on the choice of the plasmonic material. Various properties can be considered when determining the choice of nanoparticle material. Properties that may be considered can include, for example, the enthalpy of segregation ($H_{seg}$), the Gibbs free energy of the formation of the oxide, nitride or carbide (to indicate the tendency of segregation), the bond energy to oxygen (to indicate adhesion), the bond energy to oxygen versus the bond energy to the plasmonic material, the solid solubility in the plasmonic material, the binary alloy electrical resistivity and the environmental stability of the oxide phase formed.

Furthermore, the diffusivity of the material in the plasmonic material can also be considered. There are three diffusion kinetic regimes: bulk diffusion—abundant atomic migration from boundaries into grains; bulk plus grain boundary diffusion—limited diffusion from boundaries to grains; and grain boundary diffusion—bulk diffusion is negligible. In some embodiments, a metal with a diffusivity in the plasmonic material that is smaller than the plasmonic material self-diffusivity can be utilized. Such a material can promote grain boundary diffusion instead of bulk diffusion, can avoid forming an oxide layer on the surface of the plasmonic material, or both.

In some embodiments, materials that can be utilized to form oxide nanoparticles can include, for example, lanthanum (La), barium (Ba), strontium (Sr), erbium (Er), hafnium (Hf), germanium (Ge), aluminum (Al), or combinations thereof. In some embodiments, materials that can be utilized to form oxide nanoparticles can include, for example, yttrium (Y), zirconium (Zr), silicon (Si), or combinations thereof. In some embodiments, materials that can be utilized to form oxide nanoparticles can include, for example yttrium (Y). In some embodiments, materials that can be utilized to form oxide nanoparticles can include, for example, yttrium (Y), zirconium (Zr), hafnium (Hf), aluminum (Al), or combinations thereof. In some embodiments, materials that can be utilized to form nitride nanoparticles can include, for example, zirconium (Zr), niobium (Nb), or combinations thereof. In some embodiments, materials that can be utilized to form nitride nanoparticles can include, for example, titanium (Ti), tantalum (Ta), aluminum (Al), boron (B), or combinations thereof. In some embodiments, materials that can be utilized to form nitride nanoparticles can include, for example, zirconium (Zr), tantalum (Ta), or combinations thereof. In some embodiments, materials that can be utilized to form carbide nanoparticles can include, for example, silicon (Si), aluminum (Al), boron (B), zirconium (Zr), tungsten (W), titanium (Ti), niobium (Nb), or combinations thereof. In some embodiments, materials that can be utilized to form carbide nanoparticles can include, for example, silicon (Si).

In some embodiments, the plasmonic materials can include, for example gold (Au), silver (Ag), ruthenium (Ru), rhodium (Rh), aluminum (Al) and copper (Cu) or doped versions thereof. In some embodiments, the plasmonic materials can include, for example gold (Au), silver (Ag), aluminum (Al) and copper (Cu) or doped versions thereof.

In some embodiments, the amount of nanoparticles in the plasmonic material of the NFT can be quantified. In some embodiments, the amount of nanoparticles in the plasmonic material of the NFT can be quantified by determining the amount of the cation element (e.g., the metal element in a metal oxide or metal nitride) in the nanoparticles over the bulk plasmonic material and comparing that to the bulk to obtain a percent. In some embodiments, the amount of nanoparticles in the plasmonic material of the NFT can be quantified by determining a nanoparticle count and average size measurement by TEM and some sort of chemical mapping (e.g., EDX or EELS) and then comparing that to the bulk to obtain a percent. In some embodiments, the amount of nanoparticles in the plasmonic material of the NFT can be not greater than 30%, or in some embodiments, not greater than 5%.

The particular method chosen to oxidize (for example) a metal to form nanoparticles in a plasmonic material can be chosen at least in part based on the desired location of the nanoparticles. One method includes plasmonic material—metal reactive co-sputtering in $O_2$. Such methods form oxides in the grains of the plasmonic material, but not necessarily on the grain boundaries. Another method includes plasmonic material—metal co-sputtering combined with periodic oxidation. Such methods may be more likely to drive segregation and oxidation at the grain boundaries. Another method includes plasmonic material/metal multilayer deposition combined with oxidation. Such methods may be able to deliver the metal to the sidewalls but may offer a higher chance of causing incomplete segregation and thus possible optical penalties. Another method includes plasmonic material—oxide co-sputtering. Such methods may form oxides in the grains of the plasmonic material. Another method includes forming a compositional gradient. Such methods may lead to oxides filling the grain boundaries at the top and bottom of the plasmonic material film to block diffusion and may afford no dopant at the middle of the plasmonic material which could cause a lower optical penalty.

The particular method chosen to oxidize (for example) a metal to form nanoparticles in a plasmonic material can also be chosen based in part on the particular material to be oxidized. For example, if the element has a higher diffusivity in the plasmonic material, then co-sputtering combined with oxidation may be useful or advantageous. If the element has a lower diffusivity in the plasmonic material, then a multilayer approach may be useful or advantageous for delivery of the nanoparticles to the grain boundaries.

The present disclosure is illustrated by the following examples. It is to be understood that the particular examples, assumptions, modeling, and procedures are to be interpreted broadly in accordance with the scope and spirit of the disclosure as set forth herein.

EXAMPLES

Example 1: Au/2% Y Via Co-Sputtering

Gold (Au) and yttrium (Y) were co-sputtered from two separate metallic targets onto an AlO substrate. Deposition rates were adjusted to achieve 2 at % Y in the Au. The deposition was paused at each 5 nm thickness deposited and the wafer was heated to 200° C. and then oxidized in an $O_2$ radical shower. The above steps were repeated until a desired thickness was achieved.

Figure 3:
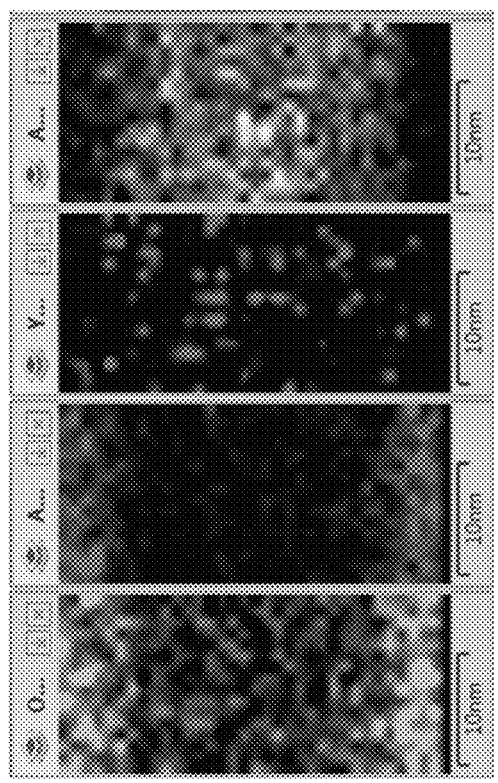
FIG. 3 shows (from bottom to top) images of the overall film and EDX chemical element mapping the oxygen content, the aluminum content, the yttrium content and the gold content.
Figure 3:
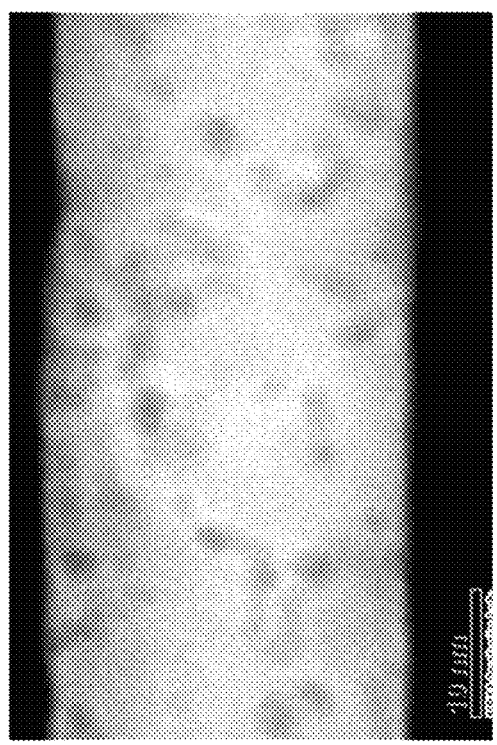

An array of various sized nanoparticles (from 1 to 3 nm in size) were realized both in the Au grains and at grain boundaries. This was confirmed by high angle annular dark field (HAADF) scanning transmission electron microscopy (STEM) imaging and EDX chemical element mapping. FIG. 3 shows (from bottom to top) images of the overall film, the oxygen (O) content, the aluminum (Al) content, the yttrium (Y) content and the gold (Au) content.

Figure 4A:
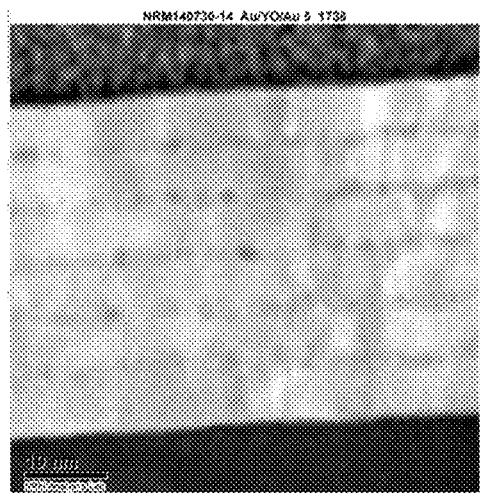
FIGS. 4A and 4B are scanning transmission electron microscopy (STEM) images of a peg cross section view (FIG. 4A) and an ABS view (FIG. 4B).
Figure 4B:
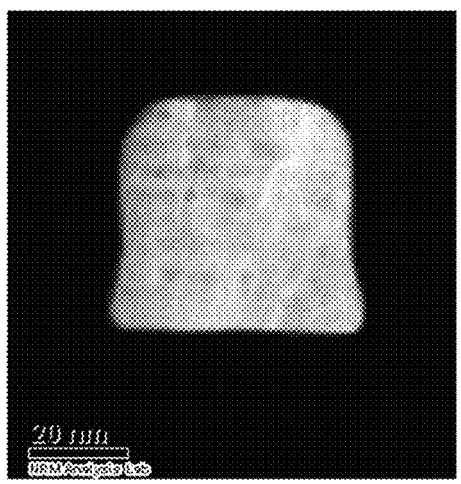

Example 2: Multilayers of 5 nm Gold/2 Å Yttrium Oxide/5 nm Gold/2 Å Yttrium Oxide Multilayers of 5 nm Au and 2 Å YO were prepared by sputtering from separate Au and YO targets. The YO nanoparticles formed at each individual Au layer surface. There was a uniform distribution of YO nanoparticles in the Au which was confirmed by STEM dark field images on two separate samples. The samples are seen in FIGS. 4A (peg cross section view) and 4B (ABS view).

Example 3: [Gold/Hafnium-Anneal-Oxidation] Repeat Process

On a substrate of $SiO_2$ 25 nm AlO was formed via ALD. On top of that a 5 Å Ta layer was formed followed by a 5 nm Au layer. Then, a x Å Hf layer was formed followed by a y nm Au layer. Then the multilayer structure was subjected to heat treatment at 200° C. in a $N_2$ environment for 15 minutes. Next, the multilayer structure was subjected to an $O_2$ radical shower. The steps of depositing the Hf/Au layer; heat treatment; and $O_2$ radical shower were repeated to obtain a total thickness of 25 to 30 nm. The variables that can be modified in such a process can include the oxidation conditions, the heat treatment conditions, the Hf thickness and the Au thickness.

Figure 5:
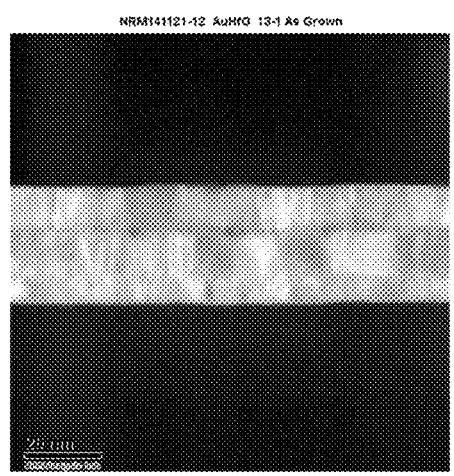
FIG. 5 shows a scanning electron microscope (SEM) image of a [10 Å Hf/10 nm Au multilayer]×2.

FIG. 5 shows an image of a [10 Å Hf/10 nm Au multilayer]×2.

All scientific and technical terms used herein have meanings commonly used in the art unless otherwise specified. The definitions provided herein are to facilitate understanding of certain terms used frequently herein and are not meant to limit the scope of the present disclosure.

As used in this specification and the appended claims, "top" and "bottom" (or other terms like "upper" and "lower") are utilized strictly for relative descriptions and do not imply any overall orientation of the article in which the described element is located.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise. The term "and/or" means one or all of the listed elements or a combination of any two or more of the listed elements.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising" and the like. For example, a conductive trace that "comprises" silver may be a conductive trace that "consists of" silver or that "consists essentially of" silver.

As used herein, "consisting essentially of," as it relates to a composition, apparatus, system, method or the like, means that the components of the composition, apparatus, system, method or the like are limited to the enumerated components and any other components that do not materially affect the basic and novel characteristic(s) of the composition, apparatus, system, method or the like.

The words "preferred" and "preferably" refer to embodiments that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure, including the claims.

Also herein, the recitations of numerical ranges by endpoints include all numbers subsumed within that range (e.g., 1 to 5 includes 1, 1.5, 2, 2.75, 3, 3.80, 4, 5, etc. or 10 or less includes 10, 9.4, 7.6, 5, 4.3, 2.9, 1.62, 0.3, etc.). Where a range of values is "up to" a particular value, that value is included within the range.

Use of "first," "second," etc. in the description above and the claims that follow is not intended to necessarily indicate that the enumerated number of objects are present. For example, a "second" substrate is merely intended to differentiate from another infusion device (such as a "first" substrate). Use of "first," "second," etc. in the description above and the claims that follow is also not necessarily intended to indicate that one comes earlier in time than the other.

Thus, embodiments of devices including a near field transducer (NFT) with nanoparticles are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:
1. A device comprising:
a near field transducer (NFT) comprising a crystalline plasmonic material having crystal grains and grain boundaries; and nanoparticles disposed in the crystal grains, in the grain boundaries, on the grain boundaries, or some combination thereof,
wherein the nanoparticles comprise:

oxides of, lanthanum (La), barium (Ba), strontium (Sr), erbium (Er), hafnium (Hf), germanium (Ge), or combinations thereof;

nitrides of zirconium (Zr), niobium (Nb), or combinations thereof; or carbides of silicon (Si), aluminum (Al), boron (B), zirconium (Zr), tungsten (W), titanium (Ti), niobium (Nb), or combinations thereof.

2. The device according to claim 1, wherein the plasmonic material comprises: gold (Au), silver (Ag), ruthenium (Ru), rhodium (Rh), aluminum (Al), copper (Cu), or combinations thereof.

3. The device according to claim 1, wherein the plasmonic material comprises: gold (Au), silver (Ag), aluminum (Al), copper (Cu), or combinations thereof.

4. The device according to claim 1, wherein the nanoparticles are located only within the crystalline grains of the plasmonic material.

5. The device according to claim 1, wherein at least 50% of the nanoparticles are located at the grain boundaries of the plasmonic material.

6. The device according to claim 1, wherein the nanoparticles are located in both the crystalline grains and the grain boundaries of the plasmonic material.

7. The device according to claim 1, wherein there is not greater than about 30% metal in the nanoparticles based on the amount of the metal in the bulk of the NFT.

8. The device according to claim 1, wherein the nanoparticles comprise:

oxides of hafnium (Hf), aluminum (Al);

nitrides of zirconium (Zr); or carbides of silicon (Si).

9. The device according to claim 1, wherein the nanoparticles comprise hafnium (Hf).

10. A device comprising:

a near field transducer (NFT) comprising a crystalline plasmonic material having crystal grains and grain boundaries; and nanoparticles disposed on the grain boundaries, wherein the nanoparticles comprise:

oxides of yttrium (Y), lanthanum (La), barium (Ba), strontium (Sr), erbium (Er), zirconium (Zr), hafnium (Hf), germanium (Ge), silicon (Si), or combinations thereof;

nitrides of zirconium (Zr), titanium (Ti), tantalum (Ta), aluminum (Al), boron (B), niobium (Nb), or combinations thereof; or carbides of silicon (Si), aluminum (Al), boron (B), zirconium (Zr), tungsten (W), titanium (Ti), niobium (Nb), or combinations thereof.

11. The device according to claim 10, wherein the plasmonic material comprises: gold (Au), silver (Ag), ruthenium (Ru), rhodium (Rh), aluminum (Al), copper (Cu), or combinations thereof.

12. The device according to claim 10, wherein the plasmonic material comprises: gold (Au), silver (Ag), aluminum (Al), copper (Cu), or combinations thereof.

13. The device according to claim 10, wherein there is not greater than about 30% metal in the nanoparticles based on the amount of the metal in the bulk of the NFT.

14. The device according to claim 10, wherein the nanoparticles comprise:

oxides of yttrium (Y), zirconium (Zr), hafnium (Hf), aluminum (Al);

nitrides of zirconium (Zr), tantalum (Ta); or carbides of silicon (Si).

15. The device according to claim 10, wherein the nanoparticles comprise yttrium (Y) or hafnium (Hf).

* * * * *